United States Patent
Gay et al.

(10) Patent No.: US 11,830,777 B2
(45) Date of Patent: Nov. 28, 2023

(54) METHOD FOR MANUFACTURING A MICROELECTRONIC DEVICE

(71) Applicant: STMicroelectronics (Rousset) SAS, Rousset (FR)

(72) Inventors: Romeric Gay, Aix-en-Provence (FR); Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/863,137

(22) Filed: Jul. 12, 2022

(65) Prior Publication Data

US 2022/0352147 A1 Nov. 3, 2022

Related U.S. Application Data

(62) Division of application No. 17/108,830, filed on Dec. 1, 2020, now abandoned.

(30) Foreign Application Priority Data

Dec. 2, 2019 (FR) ...................................... 1913605

(51) Int. Cl.
*H01L 21/82* (2006.01)
*H01L 21/8249* (2006.01)
(Continued)

(52) U.S. Cl.
CPC .......... *H01L 21/8249* (2013.01); *H01L 21/04* (2013.01); *H01L 21/4803* (2013.01);
(Continued)

(58) Field of Classification Search
CPC ..... H01L 21/04; H01L 21/4803; H01L 21/74; H01L 21/76; H01L 21/761;
(Continued)

(56) References Cited

U.S. PATENT DOCUMENTS

| 5,429,959 A | 7/1995 | Smayling |
| 2002/0084494 A1 | 7/2002 | Benaissa et al. |

(Continued)

OTHER PUBLICATIONS

Yi-Jung Jung et al.: "A novel BJT structure implemented using CMOS processes for high-performance analog circuit applications", IEEE Transactions on Semiconductor Manufacturing, IEEE Service Center, Piscataway, NJ, US, vol. 25, No. 4, Nov. 2012 (Nov. 2012), pp. 549-554, XP011471172, ISSN: 0894-6507, DOI: 10.1109/TSM. 2012. 2192749 * figures 1, 2*.

(Continued)

*Primary Examiner* — Shouxiang Hu
(74) *Attorney, Agent, or Firm* — CROWE & DUNLEVY

(57) ABSTRACT

A device includes a MOS transistor and a bipolar transistor at a same first portion of a substrate. The first portion includes a first well doped with a first type forming the channel of the MOS transistor and two first regions doped with a second type opposite to the first type that are arranged in the first well which form the source and drain of the MOS transistor. The first portion further includes: a second well doped with the second type that is arranged laterally with respect to the first well to form the base of the bipolar transistor; a second region doped with the first type that is arranged in the second well to form the emitter of the bipolar transistor; and a third region doped with the first type that is arranged under the second well to form the collector of the bipolar transistor.

29 Claims, 3 Drawing Sheets

(51) Int. Cl.
- *H01L 27/06* (2006.01)
- *H01L 29/732* (2006.01)
- *H01L 21/74* (2006.01)
- *H01L 21/04* (2006.01)
- *H01L 21/48* (2006.01)
- *H01L 21/76* (2006.01)

(52) U.S. Cl.
CPC .............. *H01L 21/74* (2013.01); *H01L 21/76* (2013.01); *H01L 27/0623* (2013.01); *H01L 27/0635* (2013.01); *H01L 29/732* (2013.01)

(58) Field of Classification Search
CPC ........... H01L 21/02697; H01L 27/0623; H01L 21/8249; H01L 27/0635; H01L 29/732; H01L 29/0649; H01L 29/1004; H01L 29/66272; H01L 29/7322; H01L 27/06
See application file for complete search history.

(56) References Cited

U.S. PATENT DOCUMENTS

| | | |
|---|---|---|
| 2005/0269597 A1 | 12/2005 | Williams et al. |
| 2009/0127629 A1 | 5/2009 | Shafi |
| 2013/0256800 A1 | 10/2013 | Qiao et al. |
| 2015/0187760 A1* | 7/2015 | Hornung ............. H01L 29/1083 257/370 |
| 2016/0372376 A1* | 12/2016 | Robinson .......... H01L 29/66659 |
| 2017/0125401 A1 | 5/2017 | Gu et al. |
| 2017/0170304 A1 | 6/2017 | Kim |

OTHER PUBLICATIONS

INPI Search Report and Written Opinion for FR Appl. No. 1913605 dated Jul. 10, 2020 (11 pages).

* cited by examiner

METHOD FOR MANUFACTURING A MICROELECTRONIC DEVICE

CROSS REFERENCE TO RELATED APPLICATIONS

This application is a divisional of U.S. patent application Ser. No. 17/108,830, filed Dec. 1, 2020, which claims the priority benefit of French Application for Patent No. 1913605, filed on Dec. 2, 2019 (now abandoned), the contents of which are hereby incorporated by reference in their entireties to the maximum extent allowable by law.

TECHNICAL FIELD

The present text relates to a microelectronic device comprising at least one MOS transistor and one bipolar transistor, as well as a method for manufacturing such a device.

BACKGROUND

The combination, in a microelectronic device, of MOS transistors and bipolar transistors can be useful insofar as these two types of transistors have different properties and can fulfill different functions.

Thus, for example, the bipolar transistors can be used to form "bandgap"-type circuits defining a very stable reference voltage with respect to temperature variations.

However, the different structures of the MOS transistors and of the bipolar transistors generally involve different manufacturing steps, in particular requiring the use of specific masks, which complicate the method for manufacturing the microelectronic device and increase the duration and cost thereof.

There is a need in the art for a circuit and a method of manufacture to provide a circuit which includes, on the same substrate, at least one high-voltage MOS transistor and at least one bipolar transistor.

SUMMARY

In an embodiment, a microelectronic device comprises: a substrate including at least one high-voltage MOS transistor and at least one bipolar transistor in the same first portion of said substrate. The first portion comprises a first well doped with a first type and electrically insulated from the substrate to form the channel of the high-voltage MOS transistor and two first regions doped with a second type opposite to the first type that are arranged on the first well to form, respectively, the source and the drain of the high-voltage MOS transistor. The first portion further comprises: a second well doped with the second type that is arranged laterally with respect to the first well to form the base of the bipolar transistor; a second region doped with the first type that is arranged on the second well to form the emitter of the bipolar transistor; and a third region doped with the first type that is arranged under the second well to form the collector of the bipolar transistor.

It is meant by "vertical" in the present text an arrangement of regions (for example layers or wells) in the thickness direction of the device. The terms "on" and "under" or "upper" and "lower" are understood in relation to this vertical direction, the main surface of the substrate on which the gate of the MOS transistor and the emitter of the bipolar transistor are arranged being considered as the upper surface of the device. In the present text, unless otherwise indicated, the terms "on" and "under" should also be understood as meaning that the considered regions are in direct contact.

It is meant by "lateral" in the present text an arrangement of regions in the direction of a main surface of the device. Such a main surface generally extends perpendicularly to the thickness of the device. Unless otherwise indicated, the term "laterally" does not mean that the considered regions are in direct contact.

The bipolar transistor is arranged vertically in the device, that is to say the emitter, the base and the collector are stacked in the thickness direction of the device. The high-voltage MOS transistor is however arranged laterally in the device.

It is meant by "high-voltage" (HV) in the present text an electrical voltage greater than or equal to 5 V.

It is meant by "low-voltage" (LV) in the present text an electrical voltage less than or equal to 3.6 V.

It is meant by "portion" in the present text a portion of the substrate that undergoes the same set of steps during the method for manufacturing transistors. Such a portion may be continuous or discontinuous, that is to say formed of several areas separate from each other within the substrate. Two portions that do not undergo the same set of steps are considered to be different in the present text. Depending on the doping level of the different wells or regions formed in one portion, said portion will be adapted for high-voltage MOS transistors or for low-voltage MOS transistors.

In such a device, the integration of the bipolar transistor in a portion dedicated to the formation of a high-voltage MOS transistor benefits from the fact that the base is formed in a well which is doped more lightly than the corresponding well of a low-voltage MOS transistor.

This results in a significant improvement in the current gain of the bipolar transistor, without requiring specific steps for the formation of said bipolar transistor in the method for manufacturing the high-voltage MOS transistor. The masks used to form the high-voltage MOS transistors can be adapted to define the different parts of the bipolar transistor, in the same doping steps.

The bipolar transistor can be of the NPN or PNP type.

In some embodiments, the first portion comprises at least a fourth region doped with the second type that is arranged on the second well laterally with respect to the second region, said fourth region forming an electrical contact plug for the base of the bipolar transistor.

Furthermore, said first portion may comprise at least a third well doped with the first type that is arranged at the periphery of the second well and in electrical contact with the third region and at least a fifth region doped with the first type that is arranged on the third well, said fifth region and said third well forming together an electrical contact plug for the collector of the bipolar transistor.

In some embodiments, the device further comprises at least one low-voltage MOS transistor in a second portion of the substrate, different from the first portion.

Said second portion comprises a first well doped with the first type, electrically insulated from the substrate to form the channel of the low-voltage MOS transistor and two first regions doped with the second type that are arranged on the first well to form, respectively, the source and the drain of the low-voltage MOS transistor, the doping of the first and second wells of the first portion being lower than the doping of the well of the second portion.

In some embodiments, the bipolar transistor is of the NPN-type, the first doping type being an N-type doping and the second doping type being a P-type doping, the third region being an insulation well that is arranged between the first and second wells and the substrate.

In other embodiments, the bipolar transistor is of the PNP-type, the first doping type being a P-type doping and the second doping type being an N-type doping, the third region being a region of the substrate that is arranged under the second well.

In another embodiment, a method for manufacturing a microelectronic device, comprises the following steps: (a) forming trenches in the substrate so as to define active areas in the first portion; (b) forming a first well doped with a first type in a first active area and a second well doped with a second type opposite to the first type in a second active area, the first well forming the channel of the high-voltage MOS transistor and the second well forming the base of the bipolar transistor; (c) forming two first regions doped with the second type that are arranged on the first well and forming a second region doped with the first type that is arranged on the second well, the first regions forming the source and the drain of the high-voltage MOS transistor and the second region forming the emitter of the bipolar transistor, and forming a third region doped with the first type that is arranged under the second well to form the collector of the bipolar transistor.

In some embodiments, step (c) comprises the formation of at least a fourth region doped with the second type that is arranged on the second well laterally with respect to the emitter, said fourth region forming an electrical contact plug for the base of the bipolar transistor.

In some embodiments, step (b) comprises the formation of at least a third well doped with the first type that is arranged at the periphery of the second well and in electrical contact with the third region, and step (c) comprises the formation of at least a fifth region doped with the first type that is arranged on the third well, said fifth region and said third well forming together an electrical contact plug for the collector of the bipolar transistor.

In a particularly advantageous manner, each step implements a single mask.

In some embodiments, the method further comprises the formation of at least one low-voltage MOS transistor in a second portion of the substrate different from the first portion.

BRIEF DESCRIPTION OF THE DRAWINGS

Other characteristics and advantages of these embodiments will appear in the following detailed description, with reference to the appended drawings in which.

Figure 1:
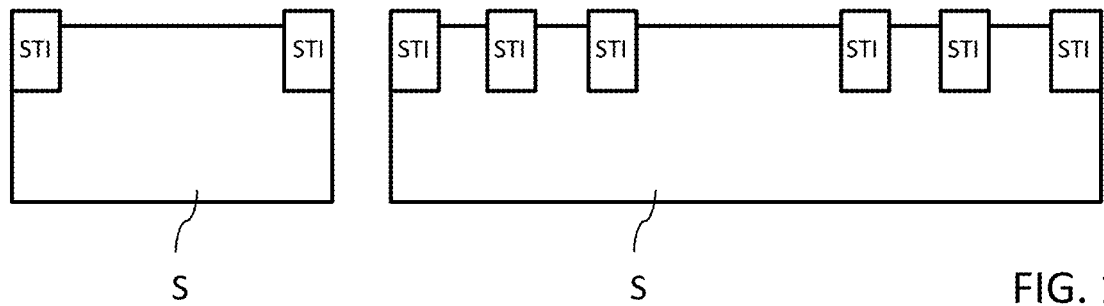
FIG. 1 is a schematic sectional view of a microelectronic device during a first step of integrating an NPN bipolar transistor in a portion intended to form a high-voltage MOS transistor, comprising the definition of the active areas in a semi-conductor substrate and the formation of electrically insulating trenches separating said areas.

For reasons of readability of the figures, the drawings are not drawn to scale. Furthermore, the drawings have been simplified so as to show only the elements useful for the understanding of the figures.

DETAILED DESCRIPTION

The formation of the bipolar transistor and of the high-voltage MOS transistor is implemented in the same portion of the substrate, that is to say a portion which undergoes the same set of treatments, common to the formation of the high-voltage MOS transistor and to the formation of the bipolar transistor. Particularly, the bipolar transistor is produced during steps dedicated to the formation of the high-voltage MOS transistor, and requires no specific step, in particular no step requiring a masking or an implantation dedicated only to the bipolar transistor.

The integration of the bipolar transistor in the portion intended for the high-voltage MOS transistor is reflected in the following structure: a first well doped with a first type that is electrically insulated from the substrate, wherein said first well forms the channel of the high-voltage MOS transistor; two first regions doped with a second type opposite to the first type that are arranged on the first well and form, respectively, the source and the drain of the high-voltage MOS transistor; a second well doped with the second type that is arranged laterally with respect to the first well and forms the base of the bipolar transistor; a second region doped with the first type that is arranged on the second well and forms the emitter of the bipolar transistor; and a third region doped with the first type that is arranged under the second well and forms the collector of the bipolar transistor.

Depending on its doping type, the third region, which forms the collector of the bipolar transistor, can be a region doped with a type opposite to that of the substrate or, if the collector is doped with the same type as the substrate, the third region is a region of the substrate itself.

Advantageously, since the base is not flush with the surface of the substrate, it is possible to form at least a fourth region doped with the second type that is arranged on the second well laterally with respect to the second region; said fourth region forming an electrical contact plug for the base of the bipolar transistor.

Finally, with the collector being buried in the substrate, it is possible to form an electrical contact plug for the collector by stacking a third well doped with the first type that is arranged at the periphery of the second well and in electrical contact with the third region which forms the collector and a fifth region doped with the first type that is arranged on the third well.

The formation of said wells and regions is carried out by steps common to the formation of the high-voltage MOS transistor and of the bipolar transistor. In other words, wells or regions doped with the same type and located at similar locations within the thickness of the substrate are formed in implantation steps common to the high-voltage MOS transistor and to the bipolar transistor.

Said steps typically comprise: the formation of electrically insulating trenches in the substrate so as to define active areas in the substrate portion; the formation of the first well and the third well in two different active areas by an implantation of dopants of the first type through a first mask; the formation of the second well in a second active area by an implantation of dopants of the second type through a second mask; thus, during the two first implantation steps mentioned above, the wells of the high-voltage MOS transistors and the base of the bipolar transistor are formed, as well as a well that is configured to electrically connect the collector to the surface of the bipolar transistor; the formation of the two first regions on the first well and the fourth region on the second well by implantation of dopants of the second type through a third mask; the source and the drain of the high-voltage MOS transistor and the contact plug of the base of the bipolar transistor are thus formed in the same step; and the formation of the second region on the second well and of the fifth region on the third well by implantation of dopants of the first type through a fourth mask, wherein the emitter and the contact plug of the collector of the bipolar transistor are thus formed in a single step.

Depending on the doping type, said wells or regions can be adapted to the formation of N-channel or P-channel MOS transistors, and NPN or PNP bipolar transistors.

The microelectronic device may comprise another portion dedicated to the formation of at least one low-voltage MOS transistor.

The method for manufacturing the microelectronic device then implements a first series of masks dedicated to the formation of the high-voltage MOS transistor integrating the bipolar transistor in a first portion of the substrate, and a second series of masks dedicated to the formation of the low-voltage MOS transistor in a second portion of the substrate. The formation of the low-voltage MOS transistor involves steps similar to those described above for the high-voltage MOS transistor, but with different implanted doses of dopants.

Figure 2:
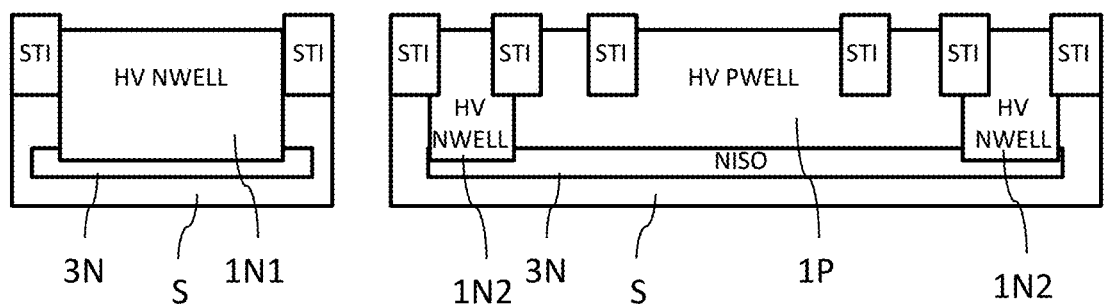
FIG. 2 is a schematic sectional view of the device of FIG. 1 during a second step of integrating the NPN bipolar transistor, in which an N-doped insulation implant and N-doped and P-doped wells are formed by implantation and make it possible to form the wells of the high-voltage MOS transistors and the collector and the base of the bipolar transistor.
Figure 3:
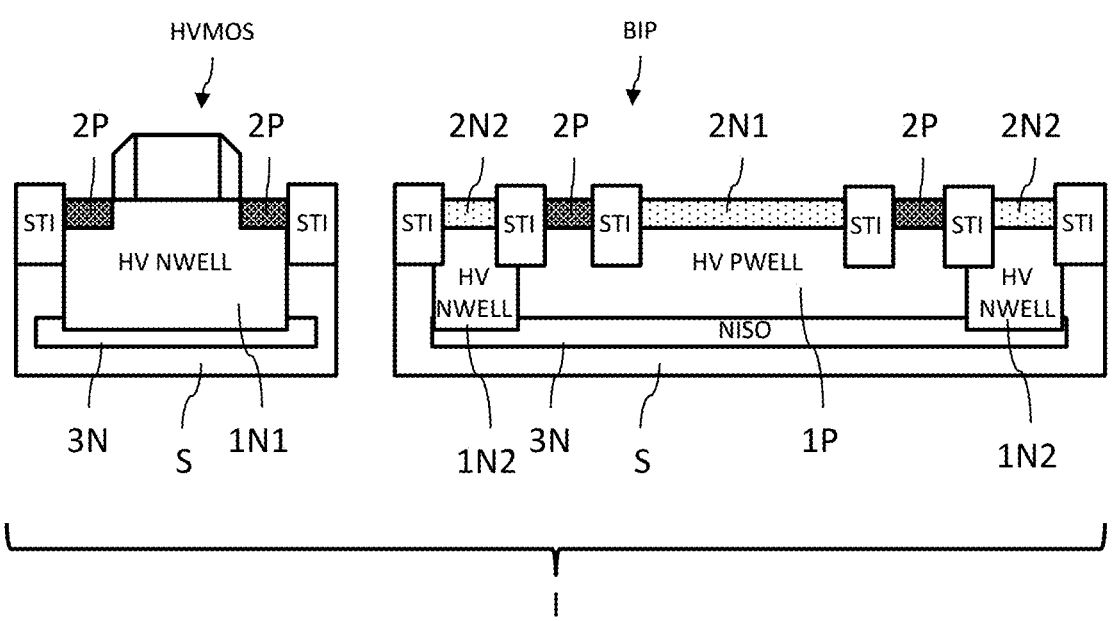
FIG. 3 is a schematic sectional view of the device of FIG. 2 during a third step of integrating the NPN bipolar transistor in which doped regions are formed on the wells to form the source and the drain of the high-voltage MOS transistor as well as the emitter, the contact plug of the base and the contact plug of the collector of the bipolar transistor.

FIGS. 1 to 3 illustrate some of these steps, for the manufacture of an NPN bipolar transistor, in a portion dedicated to the formation of a high-voltage MOS transistor.

FIG. 1 is a sectional view of a substrate S in which were formed electrically insulating trenches STI configured to delimit active areas of the device.

Although represented separately in FIGS. 1 to 3, the left and right parts belong to the same portion of the substrate, referenced I in FIG. 3. The left part of said first portion is intended for the formation of a high-voltage MOS transistor HVMOS, the right part of said first portion is intended for the formation of a bipolar transistor BIP.

The substrate is a semiconductor substrate, for example of silicon. The substrate is generally P-type doped.

With reference to FIG. 2, a first N-doped well 1N1 is formed in the active area dedicated to the high-voltage MOS transistor and a second P-doped well 1P is formed in the active area dedicated to the bipolar transistor. The first well 1N1 forms the well (body, channel) of the transistor HVMOS and the second well 1P forms the base of the bipolar transistor.

Two N-doped wells 1N2 are also formed on either side of the well 1P.

The formation of the wells 1N1 and 1N2 is carried out during the same N-type doping step, through a single mask applied on the first portion of the substrate. The wells 1N2 are therefore identical to the well 1N1 but have been designated by a different reference sign to distinguish the description of the MOS transistor and of the bipolar transistor. The formation of the second well is carried out during another P-type doping step, through another mask.

To electrically insulate the wells 1N1, 1N2 and 1P, a heavily N-doped insulation (NISO) well 3N is also formed beforehand under said wells. The well 3N in the transistor HVMOS area and the well 3N in the transistor BIP area are each, preferably, formed by a single dopant implant. This results, in particular, in the formation of the collector of the transistor BIP being made of a single buried dopant implant with well 3N in contact with the bottom of well 1P. The well 3N is intended to form the collector of the bipolar transistor. Preferably, the collector is formed from a single implantation step, which may allow a better electrical control of the collector as compared to a collector presenting a gradual architecture comprising a stack of two N-doped regions with different doping levels.

With reference to FIG. 3, two P-doped regions 2P forming the source and the drain of the transistor HVMOS are formed on the first well 1N1. An N-doped region 2N1 forming the emitter of the bipolar transistor, an N-doped region 2N2 on each of the two wells 1N2 and two P-doped regions 2P on the second well 1P are also formed on the second well 1P. The regions 2N2 form, with the wells 1N2, contact plugs for the collector of the transistor BIP. The regions 2P form contact plugs for the base of the transistor BIP. The shallow trench isolation provides a lateral separation of the region 2P from region 2N1, with the shallow trench isolation having a depth that greater than a depth of either of the region 2P or the region 2N1. It may be noted that the base contact regions 2P are electrically isolated from the emitter 2N1 by electrically insulating trenches STI, which allows preventing any short-circuit between the base and the emitter after deposition onto the doped regions, at a final stage of the manufacturing process, of a silicide layer intended to improve the electrical contact.

The formation of the regions 2P of the transistor HVMOS and of the transistor BIP is carried out during the same P-type doping step, through a single mask applied on the first portion of the substrate. The formation of the regions 2N1 and 2N2 is carried out during another N-type doping step, through another mask applied on the first portion of the substrate.

Figure 4:
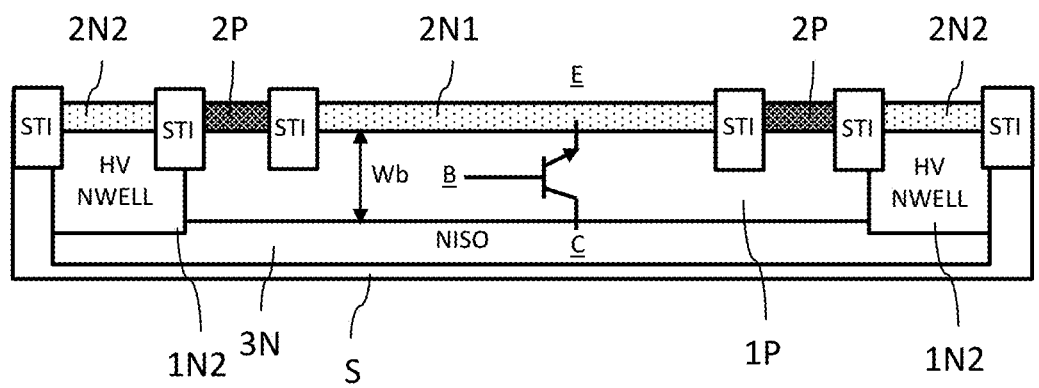
FIG. 4 is a schematic sectional view of the NPN bipolar transistor of FIG. 3.

FIG. 4 is a view of the bipolar transistor of FIG. 3, on which the typical diagram of the bipolar transistor was superimposed to facilitate the identification of the collector C, of the base B and of the emitter E of said transistor.

Figure 5:
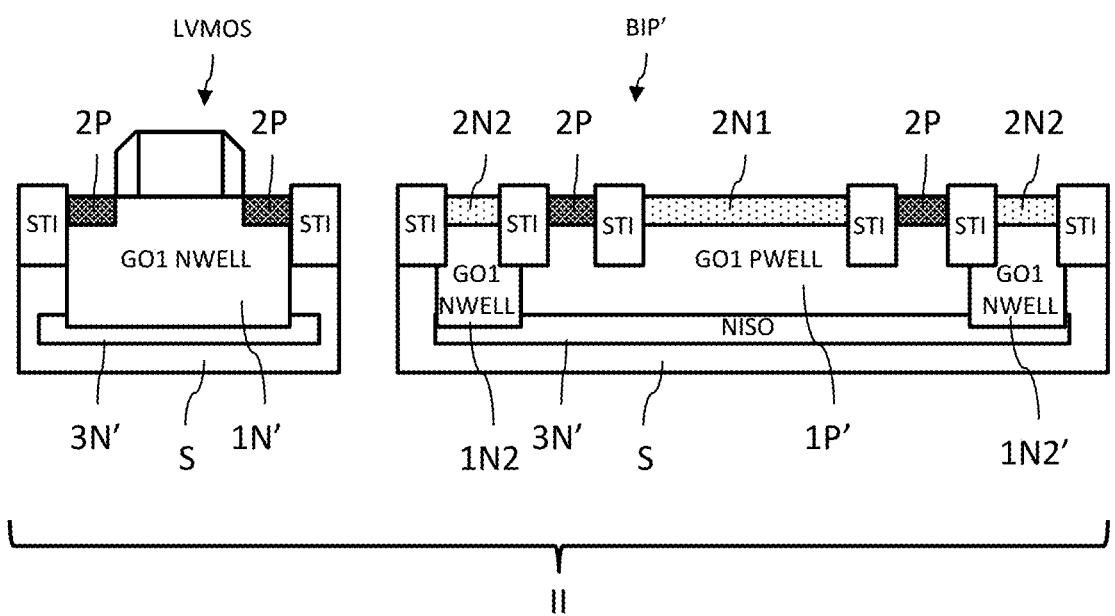
FIG. 5 is a schematic sectional view of a microelectronic device comprising an NPN bipolar transistor formed in a portion comprising a low-voltage MOS transistor.

For comparison, FIG. 5 illustrates an NPN bipolar transistor BIP' formed in a portion II of the substrate dedicated to the formation of a low-voltage MOS transistor LVMOS.

The reference signs identical to those of FIG. 3 refer to the same wells or regions; they are followed by a symbol ' when these wells or regions are doped differently between the portion I dedicated to the high-voltage and the portion II dedicated to the low-voltage.

There is a doping difference between the bipolar transistor BIP formed in the portion I and the bipolar transistor BIP' formed in the portion II in the following regions: the base which is formed in the well 1P, respectively 1P'; and the well 1N2' which electrically connects the well 3N to the region 2N2 to form the contact plug for the base.

Thus, by way of example, in the case of the transistor BIP' formed in the portion II, the well 1P' is formed by two implantations of boron with, respectively, a dose of $2.8 \times 10^{13}$ at/cm$^3$ and an energy of 75 keV, and a dose of $1.3 \times 10^{13}$ at/cm³ and an energy of 190 keV, and an implantation of boron fluoride (BF$_2$) with a dose of 7.0×10¹² at/cm³ and an energy of 25 keV. On the other hand, in the case of the transistor BIP formed in the portion I, the well 1P is formed by two implantations of boron with respectively a dose of 1.4×10¹³ at/cm³ and an energy of 195 keV, and a dose of 4.0×10¹² at/cm³ and an energy of 15 keV.

The doping levels of the other wells or regions are substantially identical in the bipolar transistors formed in the portions I and II.

Figure 6:
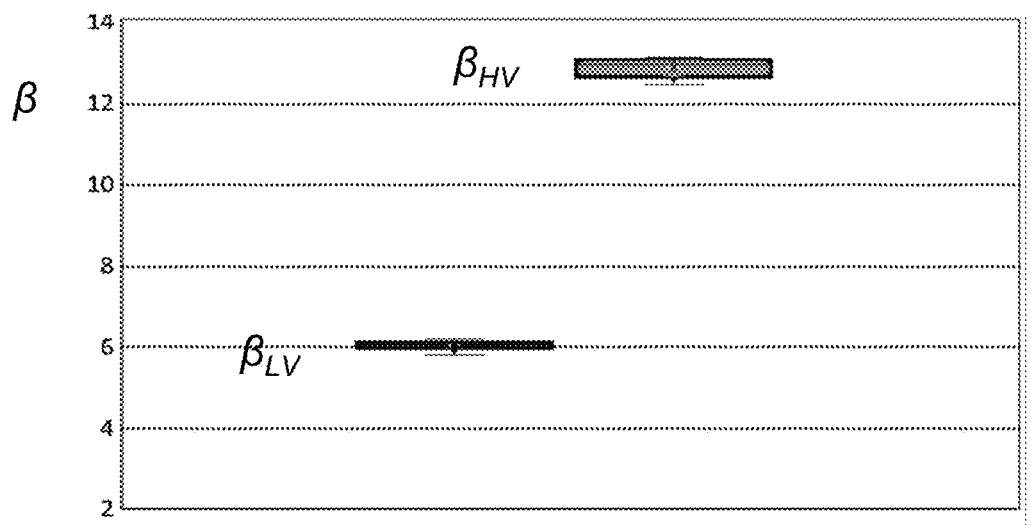
FIG. 6 presents the current gain, noted respectively $\beta_{HV}$ and $\beta_{LV}$ of the bipolar transistors of FIGS. 4 and 5.

FIG. 6 illustrates the current gain $\beta_{HV}$ of a bipolar transistor formed in a portion dedicated to the formation of a high-voltage MOS transistor (FIG. 4) and the current gain $\beta_{LV}$ of a bipolar transistor formed in a portion dedicated to the formation of a low-voltage MOS transistor (FIG. 5).

The gain $\beta_{HV}$ is approximately equal to twice the gain $\beta_{LV}$, which represents a significant advantage of the bipolar transistor of FIG. 4. The gain $\beta_{LV}$, which is in the order of 6, is considered to be low, but the gain $\beta_{HV}$ which is in the order of 12, is considered to be an interesting gain for a bipolar transistor formed in a manufacturing method not comprising a step dedicated to said bipolar transistor.

This difference between the current gains of the two bipolar transistors is explained by the definition of the gain β as a function of the properties of the emitter, of the base and of the collector of the bipolar transistor:

$$\beta = f\left(\frac{\mu_n}{\mu_p} \frac{1}{W_b} \frac{N_e}{N_b}\right)$$

where:

$\mu_n$ is the mobility of the electrons and $\mu_p$ is the mobility of the holes, $W_b$ is the width of the base (see FIG. 4), $N_e$ is the dopant concentration of the emitter and $N_b$ is the dopant concentration of the base.

The base being less doped in the bipolar transistor formed in the high-voltage portion than in the bipolar transistor formed in the low-voltage portion, the ratio $N_e/N_b$ is higher in the bipolar transistor formed in the high-voltage portion.

Furthermore, in the high-voltage portion, the dopants implanted in the insulation well (3P in the case of the transistor of FIG. 3) diffuse further towards the surface of the substrate than in the low-voltage portion, so that the width $W_b$ of the base is smaller in the bipolar transistor formed in the high-voltage portion than in the bipolar transistor formed in the low-voltage portion.

These two modifications contribute to an increase in the current gain between a bipolar transistor formed in a high-voltage portion and a bipolar transistor formed in a low-voltage portion.

Although the description above concerns an NPN bipolar transistor, the method for integrating the bipolar transistor with a high-voltage MOS transistor also applies to a PNP bipolar transistor. Indeed, there are also observed substantially lower dopant concentrations in the base of the bipolar transistor formed in the high-voltage portion than in the base of the bipolar transistor formed in the low-voltage portion, which are reflected by higher current gain for the bipolar transistor formed in the high-voltage portion than for the bipolar transistor formed in the low-voltage portion.

Figure 7:
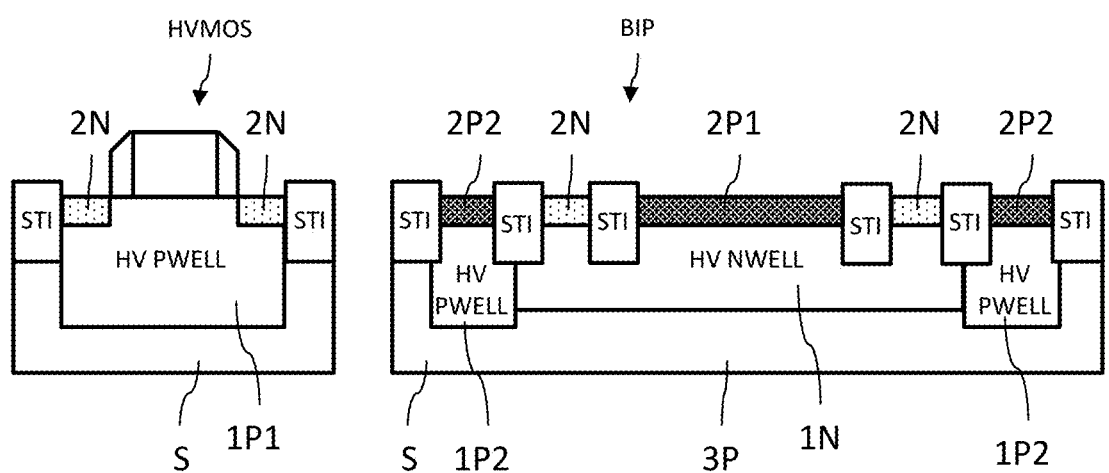
FIG. 7 is a schematic sectional view of a microelectronic device comprising a PNP bipolar transistor integrated in a portion comprising a high-voltage MOS transistor.

FIG. 7 is a schematic sectional view of a microelectronic device comprising such a PNP bipolar transistor integrated in a portion comprising a high-voltage MOS transistor.

The left part of FIG. 7 represents the high-voltage MOS transistor HVMOS.

In this part, the substrate S, which is a P-doped semiconductor substrate, comprises a P-doped well 1P1 forming the channel of the transistor HVMOS. The source and the drain of the transistor HVMOS are N-doped regions on the well 1P1, on either side of the channel.

The right part of FIG. 7 represents the PNP-type bipolar transistor BIP. Although the two parts are represented separate, they belong to the same portion of the substrate.

In the part dedicated to the bipolar transistor, the substrate S comprises a well 1N surrounded by two P-doped wells 1P2. The well 1N forms the base of the transistor.

The collector of the transistor is formed by a P-doped region 3P extending under the well 1N. The substrate being P-doped, the region 3P does not have to be individualized in the form of a well in the substrate.

The wells 1P2 are each surmounted by a P-doped region 2P2. The regions 2P2 form a contact plug for the buried collector, the wells 1P2 ensuring an electrical continuity between the regions 2P2 and the region 3P that forms the collector.

The emitter of the bipolar transistor is formed by a P-doped region 2P1 on the well 1N. Two regions 2N are also formed on the well 1N to form each a contact plug for the base.

Said transistors HVMOS and BIP are formed by a method similar to that of FIGS. 1 to 3, by reversing the doping types in the different wells and regions formed in the substrate.

In the PNP bipolar transistor thus formed, the dose of N dopant implanted to form the base is approximately 20 times lower than if said bipolar transistor had been formed in a portion dedicated to the formation of a low-voltage MOS transistor.

Thus, by way of example, in the case of a PNP bipolar transistor formed in a low-voltage portion, the well can be formed by two implantations of phosphorus with respectively a dose of 2.8×10¹³ at/cm³ and an energy of 200 keV, and a dose of 1.0×10¹³ at/cm³ and an energy of 320 keV, and an implantation of arsenic with a dose of 2.7×10¹² at/cm³ and an energy of 60 keV. On the other hand, in the case of a PNP bipolar transistor formed in the high-voltage portion I, the well 1N can be formed by two implantations of phosphorus with respectively a dose of 1.0×10¹³ at/cm³ and an energy of 315 keV, and a dose of 1.2×10¹² at/cm³ and an energy of 160 keV, and an implantation of arsenic with a dose of 1.0×10¹¹ at/cm³ and an energy of 95 keV.

The invention claimed is:

1. A method for manufacturing a microelectronic device comprising a high-voltage MOS transistor and a bipolar transistor formed in a same first portion of a substrate, said method comprising the following steps:

(a) forming trenches in the substrate to define a first active area in the first portion and a second active area in the first portion;

(b1) forming a first well doped with a first type in the first active area;

(b2) forming a second well doped with a second type opposite to the first type in the second active area;

wherein the first well forms a channel of the high-voltage MOS transistor and the second well forms a base of the bipolar transistor;

wherein step (b2) forming the second well comprises:

making a first implant of a second type dopant at a first dose level and first energy level; and making a second implant of the second type dopant at a second dose level and second energy level;

wherein first dose level is greater than the second dose level; and wherein the second energy level is greater than the first energy level;

(c) using a same first doping step, forming three first regions doped with the second type, wherein one of the three first regions is arranged in the second well and forms a base contact of the bipolar transistor and two of the three first regions are arranged in the first well and form, respectively, a source and a drain of the high-voltage MOS transistor;

(d) forming a third region doped with the first type that is arranged under and in contact with the second well to form a collector of the bipolar transistor (e) using a same second doping step, forming two second regions doped with the first type, wherein one of the two second regions is arranged in the second well to form an emitter of the bipolar transistor and another of the two second regions is arranged to form a collector contact of the bipolar transistor.

2. The method according to claim 1, wherein step (a) further comprises forming a trench in the substrate which isolates said one of the three first regions arranged in the second well to form the base contact of the bipolar transistor from said one of the two second regions arranged in the second well to form the emitter of the bipolar transistor.

3. The method according to claim 1, wherein step (a) further comprises forming a trench in the substrate which isolates said one of the three first regions arranged in the second well to form the base contact of the bipolar transistor from said another of the two second regions arranged to form the collector contact of the bipolar transistor.

4. The method according to claim 1, further comprising:
forming a third well at a periphery of the second well, said third well being doped with the first type and arranged in electrical contact with the third region.

5. The method according to claim 4, wherein step (e) further comprises forming said another of the two second regions arranged to form the collector contact of the bipolar transistor in said third well.

6. The method according to claim 1, wherein step (a) is implemented using a single mask.

7. The method according to claim 1, wherein steps (b1) and (b2) are each implemented using a single mask.

8. The method according to claim 1, wherein step (c) is implemented using a single mask.

9. The method according to claim 1, wherein step (d) is implemented using a single mask.

10. The method according to claim 1, wherein step (e) is implemented using a single mask.

11. The method according to claim 1, further comprising forming a low-voltage MOS transistor in a second portion of the substrate different from the first portion.

12. The method according to claim 1, wherein the second type dopant is boron.

13. The method according to claim 1, wherein the second type dopant is phosphorus.

14. The method according to claim 1, wherein step (b2) forming the second well further comprises:
making a third implant at a third dose level and third energy level;
wherein third dose level is less than the second dose level; and
wherein the third energy level is less than the first energy level.

15. The method according to claim 14, wherein the third implant uses the second type dopant with fluoride.

16. The method according to claim 14, wherein the third implant uses arsenic.

17. A method for manufacturing a microelectronic device comprising a high-voltage MOS transistor and a bipolar transistor formed in a same first portion of a substrate, said method comprising the following steps:

(a) forming trenches in the substrate to define a first active area in the first portion and a second active area in the first portion;

(b1) forming a first well doped with a first type in the first active area;

(b2) forming a second well doped with a second type opposite to the first type in the second active area;

wherein the first well forms a channel of the high-voltage MOS transistor and the second well forms a base of the bipolar transistor;

wherein step (b2) forming the second well comprises:
making a first implant of a second type dopant at a first dose level and first energy level; and
making a second implant of the second type dopant at a second dose level and second energy level;
wherein first dose level is greater than the second dose level; and
wherein the first energy level is greater than the second energy level;

(c) using a same first doping step, forming three first regions doped with the second type, wherein one of the three first regions is arranged in the second well and forms a base contact of the bipolar transistor and two of the three first regions are arranged in the first well and form, respectively, a source and a drain of the high-voltage MOS transistor;

(d) forming a third region doped with the first type that is arranged under and in contact with the second well to form a collector of the bipolar transistor (e) using a same second doping step, forming two second regions doped with the first type, wherein one of the two second regions is arranged in the second well to form an emitter of the bipolar transistor and another of the two second regions is arranged to form a collector contact of the bipolar transistor.

18. The method according to claim 17, wherein the second type dopant is boron.

19. The method according to claim 17, wherein the second type dopant is phosphorus.

20. The method according to claim 17, wherein step (a) further comprises forming a trench in the substrate which isolates said one of the three first regions arranged in the second well to form the base contact of the bipolar transistor from said one of the two second regions arranged in the second well to form the emitter of the bipolar transistor.

21. The method according to claim 17, wherein step (a) further comprises forming a trench in the substrate which isolates said one of the three first regions arranged in the second well to form the base contact of the bipolar transistor from said another of the two second regions arranged to form the collector contact of the bipolar transistor.

22. The method according to claim 17, further comprising:
forming a third well at a periphery of the second well, said third well being doped with the first type and arranged in electrical contact with the third region.

23. The method according to claim 22, wherein step (e) further comprises forming said another of the two second regions arranged to form the collector contact of the bipolar transistor in said third well.

24. The method according to claim 17, wherein step (a) is implemented using a single mask.

25. The method according to claim 17, wherein steps (b1) and (b2) are each implemented using a single mask.

26. The method according to claim 17, wherein step (c) is implemented using a single mask.

27. The method according to claim 17, wherein step (d) is implemented using a single mask.

28. The method according to claim 17, wherein step (e) is implemented using a single mask.

29. The method according to claim 17, further comprising forming a low-voltage MOS transistor in a second portion of the substrate different from the first portion.

\* \* \* \* \*